United States Patent
Kojima et al.

(10) Patent No.: US 7,185,244 B2
(45) Date of Patent: Feb. 27, 2007

(54) SEMICONDUCTOR INTEGRATED CIRCUIT AND ELECTRONIC SYSTEM

(75) Inventors: Hirotsugu Kojima, Tokorozawa (JP); Teruo Kitamura, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 279 days.

(21) Appl. No.: 10/823,581

(22) Filed: Apr. 14, 2004

(65) Prior Publication Data

US 2004/0264227 A1  Dec. 30, 2004

(30) Foreign Application Priority Data

Jun. 26, 2003  (JP) .............................. 2003-182258

(51) Int. Cl.
  *G11C 29/00* (2006.01)
  *H03L 7/06* (2006.01)
  *H03L 7/00* (2006.01)
(52) U.S. Cl. .................. 714/718; 327/158; 331/17
(58) Field of Classification Search ................ 714/724, 714/718, 726; 327/157, 158; 331/17
  See application file for complete search history.

(56) References Cited

U.S. PATENT DOCUMENTS 6,768,955 B2 *  7/2004  Gauthier et al. .............. 702/75
6,975,840 B2 *  12/2005  Lin .............................. 455/76

FOREIGN PATENT DOCUMENTS

JP  10-041746  2/1998

* cited by examiner

*Primary Examiner*—James C. Kerveros
(74) *Attorney, Agent, or Firm*—Miles & Stockbridge PC

(57) ABSTRACT

The invention provides a semiconductor integrated circuit for communication control and a wireless communication system using the same realizing reduction in the size of a chip and the size of a module by enabling trimming data to be written into a nonvolatile memory without increasing the number of external terminals. A rewritable nonvolatile memory is provided in a semiconductor integrated circuit, characteristics of circuits including an electronic part are measured and trimming data for correcting variations in the characteristics is stored in the nonvolatile memory. A pin and an interface circuit such as a test pin and a JTAG interface circuit which are originally provided for the semiconductor integrated circuit also serve as an input pin and an interface circuit for sending and storing the trimming data to the nonvolatile memory.

19 Claims, 14 Drawing Sheets

SEMICONDUCTOR INTEGRATED CIRCUIT AND ELECTRONIC SYSTEM

CROSS-REFERENCE TO RELATED APPLICATION

The present application claims priority from Japanese patent application JP 2003-182258 filed on Jun. 28, 2003, the content of which is hereby incorporated by reference into this application.

BACKGROUND OF THE INVENTION

The present invention relates to a technique effective when applied to adjustment of a change in a circuit characteristic due to variations in external electronic parts or devices of a semiconductor integrated circuit (hereinbelow, also written as IC), particularly, adjustment of a frequency shift of an oscillator having an oscillating element. More particularly, the invention relates to a technique effective when applied to an IC for communication control of, for example, a Bluetooth communication standard and a communication system using the IC.

One of wireless communication standards is the standard called Bluetooth for a short-distance wireless communication using a frequency band from 2.4 GHz to 2.48 GHz. A wireless communication system conformed with the Bluetooth standard (called Bluetooth system) is generally constructed by an RF IC having functions of transmitting/receiving signals and modulating/demodulating signals, a baseband LSI (Large Scale Integrated circuit) for performing a baseband process for generating, for example, I/Q signals on the basis of transmission data and a baseband process on reception data, and generating RF IC control signals, and a program memory including nonvolatile memories such as a ROM (Read Only Memory) for storing a control program (user program) and an EEPROM (Electrically Erasable Programmable Read Only Memory).

In the Bluetooth system, a control for mutual communications with a device as the party on the other end is executed by a function circuit called a link controller. In the Bluetooth communication, to synchronize clocks and also establish communication connection between a master device and a slave device, on the basis of a clock signal of 3.2 kHz called a Bluetooth clock, packet data is exchanged in cycles (625 µs) which is twice as long as 3.2 kHz.

When the mutual communication connection is established, each link controller calculates a deviation amount between the Bluetooth clock of itself and a Bluetooth clock of the device on the other end. The link controller on the slave side corrects the clock deviation and performs communication control. By the control, the communication operation on the master side and that on the slave side are synchronized with each other. In the Bluetooth standard, frequency precision of ±20 ppm from the Bluetooth clock of 3.2 kHz is demanded. Generally, the clock is generated by frequency-dividing a reference clock of 8 MHz, 13 MHz, or the like.

Hitherto, in the Bluetooth system, to generate a clock of 8 MHz, 13 MHz or the like as a reference clock, a quartz oscillator having relatively high precision is generally used among oscillators which are easily available. Even an oscillator using a quartz oscillator, however, has a problem such that the oscillation frequency is deviated from a desired value due to manufacture variations of the oscillator itself, in addition, parasitic capacitance of a mounting board, manufacture variations of capacitive elements connected together with the oscillator, a temperature change, and fluctuations in the power source voltage.

As a technique for correcting a frequency deviation in the oscillator using the quartz oscillator, an invention is provided in which, for example, a variable capacitance diode is connected to an oscillator, a nonvolatile memory (EEPROM) for prestoring trimming data for correcting variations detected by measurement is provided, the trimming data read from the nonvolatile memory is converted by a D/A converter to an analog voltage, the analog voltage is applied to the variable capacitance diode and, by changing the capacitance value, the oscillation frequency of the oscillator is adjusted to zero (refer to Japanese Unexamined Patent Publication No. Hei 10 (1998)-41746).

SUMMARY OF THE INVENTION

The inventors herein have paid attention to the fact that the nonvolatile memory such as an EEPROM is used for storing a user program in the Bluetooth system and have examined a system as shown in FIG. 9 in which the EEPROM is used as a nonvolatile memory for holding trimming data for correcting a deviation in the oscillation frequency of the quartz oscillator for generating a reference clock.

Shown in FIG. 9 are an RF IC 100, a baseband LSI 200, a nonvolatile memory 400, a crystal oscillator XTAL, and a variable capacitance diode DV. A quartz oscillating device 120 including the crystal oscillator XTAL is provided on the side of the RF IC 100, and a D/A converter 250 for D/A converting trimming data to thereby generate an analog voltage to be applied to the variable capacitance diode DV is provided in the baseband LSI 200. The RF IC 100, baseband LSI 200, and nonvolatile memory 400 are mounted on a single substrate such as a ceramic substrate and constructed as a module.

In the system shown in FIG. 9, a user program is stored in the nonvolatile memory 400. Generally, the trimming data can be measured only after the nonvolatile memory 400 is mounted on the system. If both the trimming data and the user program are written into the nonvolatile memory 400, as shown in FIG. 9, the writing has to be executed in a state where the RF IC 100, baseband LSI 200, and nonvolatile memory 400 are mounted on a single substrate. As methods of storing a user program into the nonvolatile memory 400 in such a mounting state, there are a method of writing the user program into the nonvolatile memory 400 by a CPU 220 in the baseband LSI 200 and a method of writing the user program into the nonvolatile memory 400 by a separate device.

However, to perform writing on the nonvolatile memory 400 not by the CPU 220 in the baseband LSI 200 but the separate device, a mechanism for electrically disconnecting the CPU 220 and the nonvolatile memory 400 from each other and a terminal for inputting an address for writing and data have to be provided for the board of the module. It was found to be difficult to realize it since there are physical limitations on an external circuit and the number of terminals which can be provided for the module. When such an external circuit and terminals are provided for the module, the size of the module increases and it disturbs miniaturization of the system.

In the method of writing the nonvolatile memory 400 by the CPU 220 in the baseband LSI 200, it is necessary to transmit a command of writing to the nonvolatile memory and a program to be written by serial transmission or the like from the outside of the module to the CPU 220 in the baseband LSI 200 and then execute writing. Consequently, time necessary for writing the nonvolatile memory is much longer as compared with writing by a general EEPROM writer. For example, it takes nearly 30 seconds in the case of a flash memory of 2 Mbytes, and there are problems such that the mass productivity is low and the manufacturing cost is high.

Further, in the wireless communication system shown in FIG. 9, the program stored in the nonvolatile memory 400 is a program necessary for a communication process. Consequently, a problem arises such that, after the nonvolatile memory 400 is assembled in an actual apparatus such as a portable telephone, it is difficult to write or rewrite trimming data for adjusting the frequency of the oscillator and communication parameters in the nonvolatile memory while executing the communication process.

An object of the invention is to provide a semiconductor integrated circuit for communication control and a wireless communication system using the same, which realize smaller sizes of a chip and a module by enabling trimming data to be written into a nonvolatile memory without increasing the number of external terminals.

Another object of the invention is to provide a semiconductor integrated circuit for communication control and a wireless communication system using the same which realize higher mass productivity and lower manufacturing cost by shortening time required to write a nonvolatile memory. Further, the invention provides a technique which can be applied not only to the semiconductor integrated circuit for communication control and the wireless communication system but also to other semiconductor integrated circuits and electronic systems.

Further another object of the invention is to provide a semiconductor integrated circuit for communication control and a wireless communication system using the same capable of writing/rewriting to the nonvolatile memory data for correcting a deviation in a circuit characteristic caused by variations in external electronic parts such as an oscillator and data peculiar to the system, while executing a communication process.

The above and other objects and novel features of the invention will become apparent from the description of the specification and the appended drawings.

An outline of representative ones of inventions disclosed in the specification will be described as follows.

A rewritable nonvolatile memory is provided in a semiconductor integrated circuit, characteristics of circuits including an electronic part are measured, and trimming data for correcting characteristic variations is stored in the nonvolatile memory. As an input pin and an interface circuit used for storing the trimming data to the nonvolatile memory, pins such as a test pin and an interface circuit for test which are originally provided for the semiconductor integrated circuit are used. An example of such an interface circuit is a JTAG interface circuit called a TAP (Test Access Port) specified by a standard for a boundary scan test, which is determined by the JTAG (Joint Test Action Group).

By the means, without increasing the number of external terminals and external circuits, trimming data can be written to the nonvolatile memory, so that the size of the chip and the size of the module can be reduced and, also in the case where the characteristics of the circuit change during use, the trimming data can be rewritten. According to the invention, changes in the circuit characteristics caused due to not only variations in electronic parts but also variations in elements constructing the circuit can be corrected.

Further, a rewritable nonvolatile memory is provided in the semiconductor integrated circuit, characteristics of circuits including electronic parts are measured, trimming data for correcting variations in the characteristics is stored in the nonvolatile memory, and a program for controlling a system in which the semiconductor integrated circuit is stored in a program memory such as a mask ROM or an electrically erasable and programmable nonvolatile memory (electrically erasable and programmable ROM (EEPROM) or flash memory). The mask ROM may be an on-chip ROM or a ROM formed as a separate chip.

By the means, a process of writing a program into a nonvolatile memory becomes unnecessary. Thus, time required for writing the nonvolatile memory is shortened, mass productivity can be increased, and the manufacturing cost can be reduced. In a system on which a mask ROM for storing a program, formed as a separate chip and a semiconductor integrated circuit having therein the nonvolatile memory are mounted, as an input pin and an interface circuit used for sending and storing the trimming data to the nonvolatile memory, a pin such as a test pin and an interface circuit which are originally provided for the board are used. With the configuration, the size of the module can be reduced.

Further, a rewritable nonvolatile memory is provided in the semiconductor integrated circuit. Characteristics of circuits including electronic parts are measured, and trimming data for correcting variations in the characteristics and data peculiar to a system in which the semiconductor integrated circuit is assembled is stored in the nonvolatile memory. As an input pin and an interface circuit used for sending and storing the trimming data and the data peculiar to the system to the nonvolatile memory, a pin such as a test pin and an interface circuit which are originally provided for the board are used.

By the means, without increasing the number of external terminals, trimming data and data peculiar to the system stored in the nonvolatile memory can be rewritten. Consequently, the size of the chip and the size of the module can be reduced. Necessary data can be written in a state where the semiconductor integrated circuit is mounted on the module board and, also in the case where the system configuration of operation mode is changed, the data can be rewritten.

DETAILED DESCRIPTION OF THE PREFERRED

Preferred embodiments of the invention will now be described with reference to the drawings.

Figure 1:
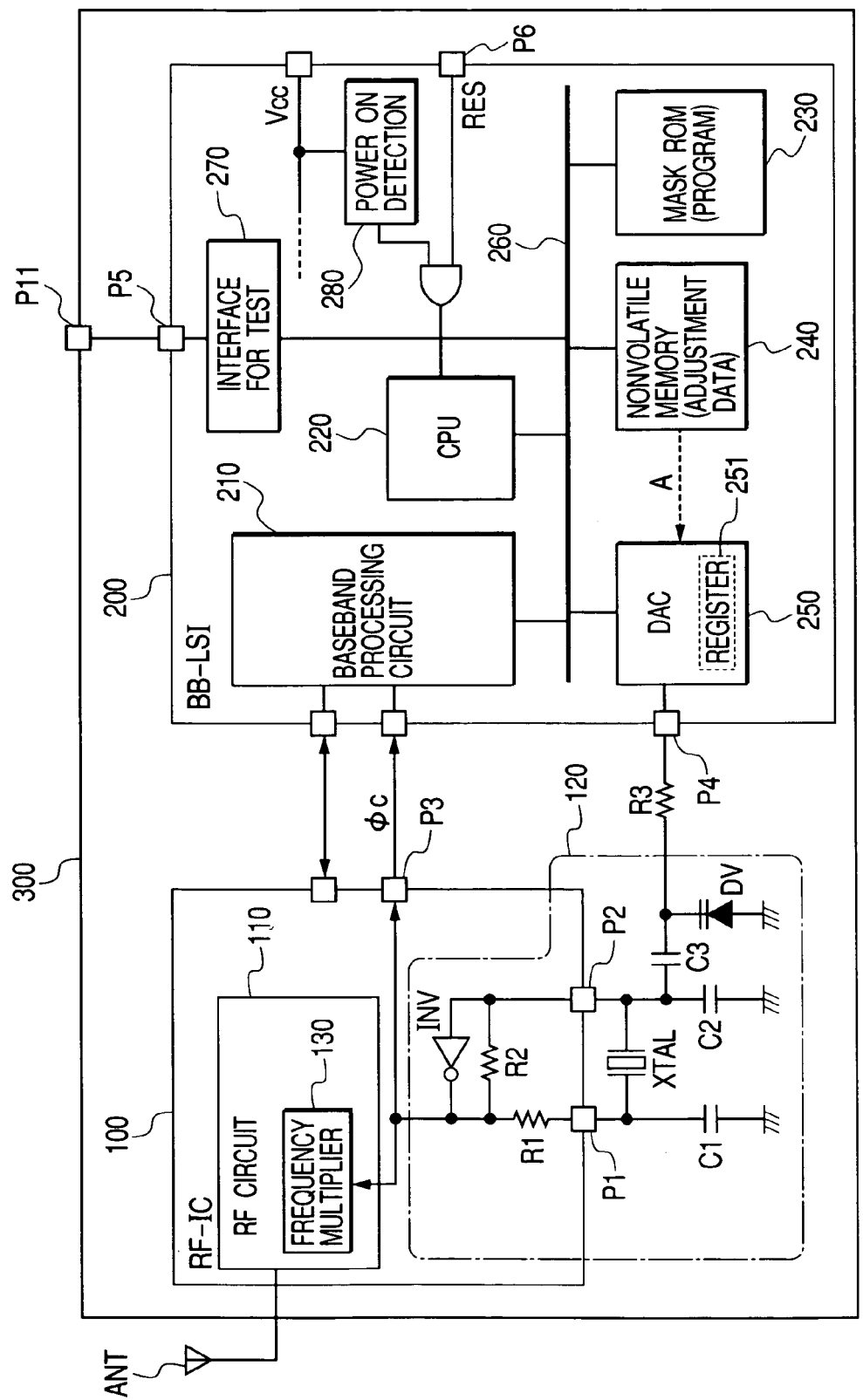
FIG. 1 is a block diagram showing an example of a system configuration in the case where the invention is applied to a Bluetooth communication system.

FIG. 1 is a block diagram showing an example of the system configuration in the case where the invention is applied to a wireless communication system such as a Bluetooth system.

The wireless communication system of the embodiment of FIG. 1 includes an RF IC 100 for modulating a transmission signal, demodulating a reception signal, and converting the frequency of the transmission/reception signal, and a baseband LSI 200 for performing a baseband process and controlling the RF IC 100. The semiconductor chips of the RF IC 100 and the baseband LSI 200 and external devices are mounted on a substrate such as a ceramic substrate over which lines for connecting the chips are formed, thereby constructing a module 300 for communication.

Although not shown, the RF IC 100 has a transmission circuit and a reception circuit. In FIG. 1, a circuit obtained by integrating the transmission circuit and the reception circuit is shown as the RF circuit 110. In the embodiment, a power amplifier (RF power amplifying circuit) for driving an antenna ANT and transmitting data is not shown. In the case where a power amplifier is necessary, a module including the power amplifier, a bias circuit, an impedance matching circuit, and a transmission/reception change-over switch is connected between the RF IC 100 and the antenna ANT.

As shown in FIG. 1, in the wireless communication system of the embodiment, a quartz oscillator XTAL and capacitors C1 and C2 are connected to external terminals P1 and P2 of the RF IC 100, and a quartz oscillating circuit 120 is constructed by an inverter INV and resistors R1 and R2 in the chip. Although not limited, as the external quartz oscillator XTAL, an oscillator having a natural frequency of, for example, 13 MHz is used. In the embodiment, a variable capacitance diode DV is provided for the quartz oscillating circuit 120. By changing a voltage to be applied to the variable capacitance diode DV, the oscillation frequency can be adjusted.

The RF IC 100 of the embodiment is provided with a frequency multiplier 130 including a PLL circuit and the like functioning as an RF source for using the oscillation signal of 13 MHz generated by the quartz oscillating circuit 120 as a reference signal and generating an RF signal used for communication. The oscillation signal of 13 MHz generated by the quartz oscillating circuit 120 is also supplied as a reference clock signal φc from an external terminal P3 to the baseband LSI 200.

In the embodiment of FIG. 1, external devices are used as the capacitors C1 and C2 and the variable capacitance diode DV as components of the quarts oscillating circuit 120. The external devices may be provided on the inside of the chip of the RF IC 100.

The baseband LSI 200 includes: a baseband processing circuit 210 for generating, for example, an I/Q signal which is sent to the RF IC 100 on the basis of transmission data and extracting reception data from a reception signal demodulated by the RF IC 100; a microprocessor (CPU) 220 for control; a mask ROM 230 as a program memory in which a program to be executed by the CPU 220 is stored; a nonvolatile memory 240 such as an EEPROM or a flash memory; a D/A converting circuit 250 for converting a digital signal to an analog signal and outputting the analog signal from an external terminal P4 to the outside of the chip; an internal bus 260 enabling data transfer among the circuit blocks to be performed; an interface circuit 270 for test; and a power-on detecting circuit 280.

The memory capacity of the mask ROM 230 is a few Mbytes and that of the nonvolatile memory 240 is small capacity of a few Kbytes or less. The mask ROM 230 takes the form of an electrically erasable programmable nonvolatile memory (electrically erasable programmable ROM (EEPROM) or a flash memory). The mask ROM 230 may be formed as a separate chip. In short, a memory for storing trimming data and a program memory for storing a program are different memories. Although not shown, a function circuit called a link controller for performing a control for establishing a mutual communication connection to a device as the party on the other end is also provided in the baseband LSI 200.

In the embodiment, as the interface circuit 270 for test, a JTAG interface specified in a standard for a boundary scan test determined by the JTAG is used. The external terminal P5 to which the interface circuit 270 is connected is connected to a test terminal P11 provided for the module 300. Therefore, in the embodiment, the external terminal P5 of the baseband LSI 200 and the test terminal P11 on the module 300 side correspond to each other at 1:1. Although only one external terminal P5 connected to the interface circuit 270 is shown, actually, there are five external terminals P5 as will be described later.

The wireless communication system of the embodiment is constructed so that the oscillation frequency of the quartz oscillating circuit 120 is measured in a state where the RF IC 100 and the baseband LSI 200 are mounted on the module substrate, and trimming data necessary to correct a frequency shift is stored into the nonvolatile memory 240 in the baseband LSI 200.

When a power-on reset signal supplied from the power-on detecting circuit 280 is input at the time of turn-on of the power source or a reset signal RES is input from the outside of the chip to a terminal P6, the CPU 220 reads the trimming data from the nonvolatile memory 240 and sends it to the D/A converter 250 via the internal bus 260. The trimming data is converted to an analog voltage, and the output voltage is applied to the variable capacitance diode DV of the quartz oscillating circuit 120 via the external terminal P4 and a resistor R3, thereby adjusting the oscillation frequency.

The D/A converter 250 has a register 251 for holding the trimming data read from the nonvolatile memory 240. Instead of supplying the trimming data stored in the nonvolatile memory 240 to the D/A converter 250 via the internal bus 260, the trimming data may be supplied directly to the D/A converter 250 as shown by the arrow A in FIG. 1. In this case, depending on the configuration of the nonvolatile memory 240, the register 251 may not be provided in the D/A converter 250.

In a device on which the system capable of performing communications in conformity with the Bluetooth standard is mounted as shown in FIG. 1, to synchronize communications among devices, the Bluetooth standard specifies that time management is to be performed by a common clock called the Bluetooth clock which operates every 312.5 μsec (3.2 kHz) and the precision of the clock is to be within +−20 ppm.

As described above, in the Bluetooth communication system, the precision required for a clock signal as a reference is very high. Consequently, as in the embodiment, the function of adjusting the frequency of the quartz oscillating circuit 120 is required. In the system of FIG. 1, the clock signal for generating the Bluetooth clock is generated by frequency-dividing the oscillation signal φc of 13 MHz generated by the quartz oscillating circuit 120 by a frequency divider (not shown) on the baseband LSI 200 side.

Although the trimming data for the quartz oscillating circuit 120 is stored in the nonvolatile memory 240 provided in the chip in the embodiment, in addition, application data such as an ID code can be stored into the nonvolatile memory 240 either from the outside of the chip or directly by the CPU. In the nonvolatile memory 240, an MAC (Media Access Control) address for giving an identification code peculiar to each of products can be also stored. Further, although the D/A converter 250 for adjusting the oscillation frequency of the quartz oscillating circuit 120 is provided in the baseband LSI 200 in the embodiment, it is also possible to provide the D/A converter 250 on the outside of the chip and the trimming data is output in the form of a digital value from the baseband LSI 200.

The time management in a network realized by the Bluetooth communication will now be described.

Figure 4:
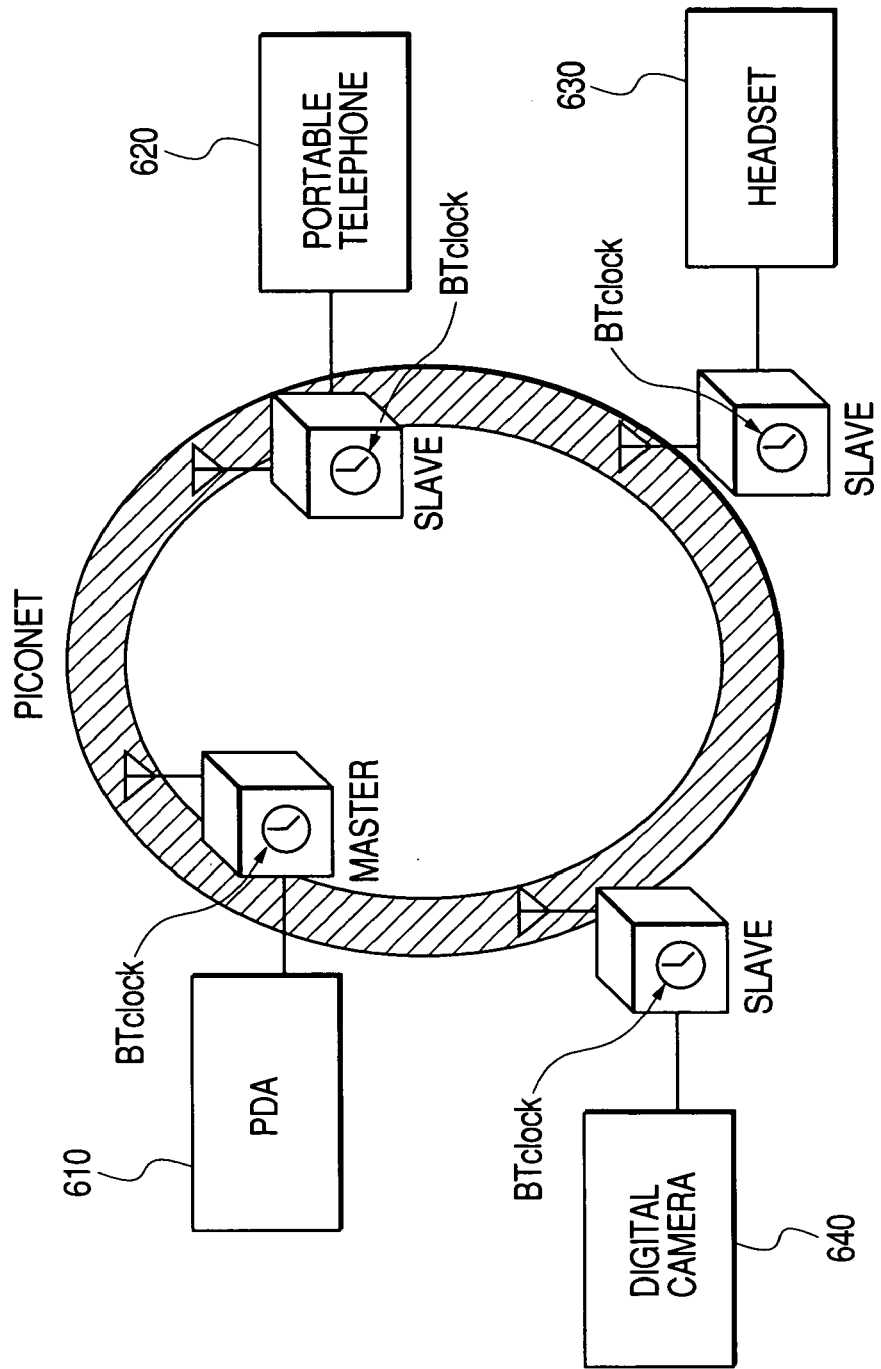
FIG. 4 is a conceptual diagram showing an example of the configuration of a network called a piconet connected so as to be able of perform data communications in conformity with the Bluetooth standard.

FIG. 4 shows an example of the configuration of a network called a piconet connected so as to be able to perform communications in conformity with the Bluetooth standard. One piconet is a network in which seven slave devices can be connected at the maximum to one master device. The piconet of FIG. 4 is constructed by a PDA (Personal Digital Assistant) 610 as a master device, a portable telephone 620 as a slave device, a headset 630, and a digital camera 640.

Figure 3:
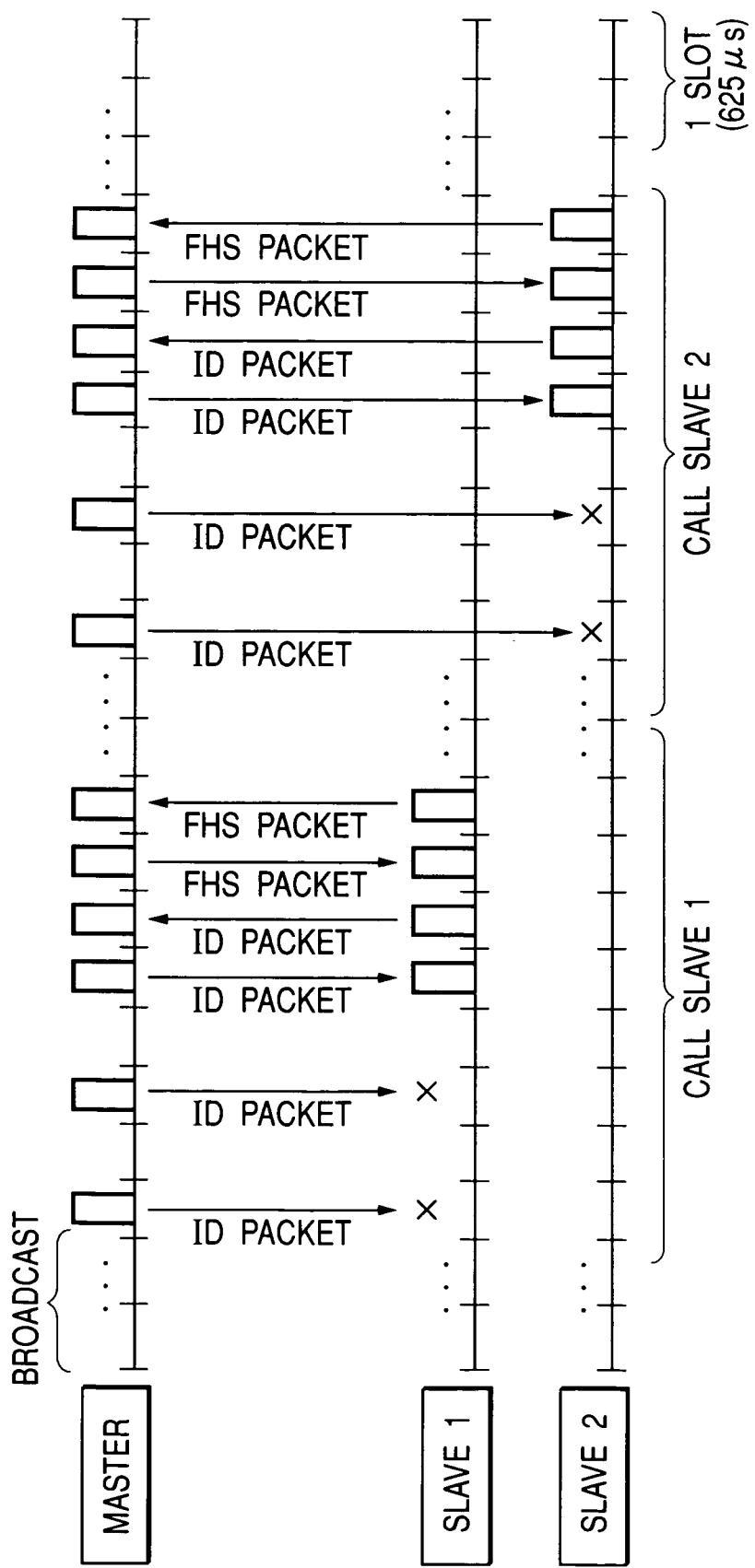
FIG. 3 is a time chart showing how Bluetooth clocks of a master device and a slave device are synchronized.

The master device sends an active member address to an active slave device to manage communications with the slave devices and also manages synchronization of the Bluetooth clocks. FIG. 3 shows how the Bluetooth clocks are synchronized between the master and slave devices.

To recognize an active slave device existing in the proximity prior to the synchronizing process, first, the master device performs broadcast which is transmission of an inquiry packet called an IQ packet to all of the slave devices, receives a response packet called an FHS packet returned from the slave devices in response to the transmission, and grasps the slave devices participating in the piconet. The slave device performs a scan process of checking whether an inquiry signal from the master device is received or not. When the slave device can receive the inquiry signal from the master device side by the scan process, the slave device transmits a response packet to the master device.

Subsequently, the master device sequentially performs a process of calling each of the slave devices as shown in FIG. 3. In the calling process, first, the master device sends an ID packet including an ID code for identifying the device to each of the active slave devices in the piconet. When an ID packet responding to the transmitted ID packet is received, the master device sends an FHS packet for synchronization of the Bluetooth clocks and address exchange, and receives a packet in response to the FHS packet.

By exchanging the FHS packets, the slave device makes the Bluetooth clock of itself match with the Bluetooth clock of the master device, the Bluetooth clocks of all of the devices participating in one piconet are synchronized. The Bluetooth communication is performed by setting a period of two 3.2 kHz Bluetooth clocks (626 μs) as one slot and transmitting/receiving packet data alternately between the master device and the slave device every slot.

Figure 2:
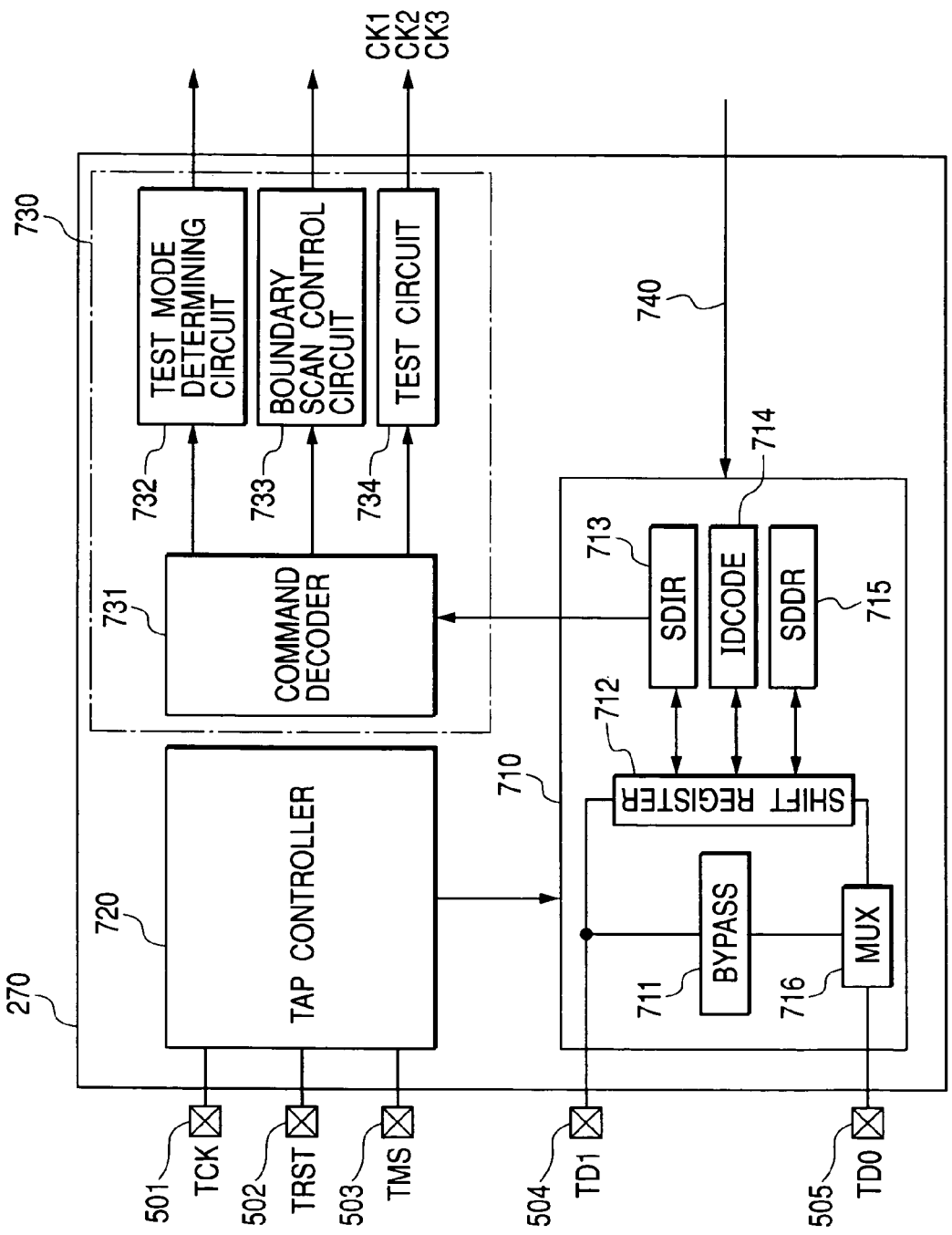
FIG. 2 is a block diagram showing a concrete example of a JTAG interface circuit 270 in a baseband LSI illustrated in FIG. 1.

FIG. 2 shows a concrete example of the JTAG interface circuit 270 in the baseband LSI illustrated in FIG. 1.

The JTAG interface circuit 270 is a circuit serving as an interface for a shift scan test in an IC specified in the IEEE 1149.1 standard and a boundary scan test between ICs.

The JTAG interface circuit 270 is constructed by: a command data input/output circuit 710 serving as a TAP (Test Access Port) for receiving test data and a command which is supplied serially from the outside and serially outputting test result data from the circuit blocks in the chip to the outside; a TAP controller 720 for controlling the input/output circuit 710; and a test controller 730 for decoding a command received by the command/data input/output circuit 710 and executing a test control corresponding to the command.

The TAP controller 720 is connected to three dedicated external terminals 501 to 503 and can receive a test mode select signal TMS for designating a test mode, a test clock TCK, and an asynchronous reset signal TRST from the terminals 501, 502, and 503, respectively. The TAP controller 720 generates control signals for controlling registers 711 to 715 and a multiplexer 716 in the command data input/output circuit 710 on the basis of signal levels of the signals TMS, TCK, and TRST.

The command/data input/output circuit 710 includes: a bypass register 711 used for shifting test data from an input port terminal 504 to an output port terminal 505; a shift register 712 for performing serial-to-parallel conversion on input/output data; an instruction register (SDIR) 713 in which a command for controlling an internal test method is stored; a device ID register (IDCODE) 714 for setting a serial number peculiar to the chip; a data register (SDDR) 715 used for transmitting a specific signal to each of the circuit blocks; and a multiplexer 716 (MUX) for switching a path of the bypass register 711 and the shift register 712.

The command/data input/output circuit 710 is provided with the input terminal 504 of a command or data TDI and the output terminal 505 of test result data TDO. The input test data TDI is supplied to the registers 713 to 715 via the shift register 712. To the registers 713 to 715 in the command/data input/output circuit 710, values from the circuit blocks in the chip can be stored via a signal line 740 serving as a scan path.

The test controller 730 has not only the command decoder 731 and the test mode determining circuit 732 but also a boundary scan control circuit 733 and a test circuit 734. The boundary scan control circuit 733 controls a boundary scan path for testing transmission/reception of signals to/from other semiconductor integrated circuits. The test circuit 734 generates test clock signals and control signals such as clock signals CK2 and CK3 for scan for shifting a flip flop on the scan path at the time of a shift scan test and a clock signal CK1 for latch for latching a monitor signal.

When a test command is input from the data input terminal 504 to the command/data input/output circuit 710, the test command is stored in the instruction register 713, and the command decoder 731 decodes the command. The test mode determining circuit 732 determines the kind of a test mode and a circuit block to be tested on the basis of the result of decoding of the command decoder 731, and generates a control signal in accordance with the result of determination.

In the JTAG standard, some indispensable commands to be set in the instruction register 713 are prepared. In addition, some option commands can be provided. In the embodiment, as the option commands, a write command for writing data supplied from the outside of the chip to the nonvolatile memory 240 and a verify command are provided.

When the input command is found to be the memory write command from the result of decoding of the command decoder 731, the test mode determining circuit 732 generates an enable signal for enabling the nonvolatile memory 240 and a write control signal, supplies the signals to the nonvolatile memory 240, and transfers a write address and write data input from the data input terminal 504 to the nonvolatile memory 240 via the scan path in the chip.

In the case where the input command is the memory verify command, the test mode determining circuit 732 generates an enable signal for enabling the nonvolatile memory 240 and a read control signal and supplies the generated signals to the nonvolatile memory 240. The test mode determining circuit 732 transfers the read address input from the data input terminal 504 to the nonvolatile memory 240 via the scan path in the chip to allow data reading operation to be executed. Similarly, the test mode determining circuit 732 transfers the data read from the nonvolatile memory 240 to the command/data input/output circuit 710 via the scan path and outputs the data from the data output terminal TDO.

As an interface other than the JTAG interface or an interface serving also as the JTAG interface, there is a debug interface for connecting an emulator to an LSI having therein a CPU and debugging a program to be executed by the CPU. When the debug interface is used, a command can be executed and a memory space can be accessed by the CPU. Consequently, by assigning the nonvolatile memory 240 to the memory space of the CPU 220 and controlling a signal necessary for rewriting data such as application of a high voltage for writing, data can be written into the nonvolatile memory 240 by using the debug interface in a state where the chip is mounted on the module.

As described above, by writing trimming data or the like to the nonvolatile memory 240 by using the interface originally provided for a test on the LSI, the writing operation can be performed without providing a dedicated external terminal. With the configuration, the number of external terminals can be prevented from increasing and, accordingly, the chip size and the module size can be reduced.

A second embodiment of the invention will now be described with reference to FIG. 5.

In the second embodiment, some upper bits (for example, five bits) in the frequency trimming data of the quartz oscillating circuit 120 are stored in the nonvolatile memory 240, and some lower bits (for example, three bits) are supplied from the register 252 which can be set by the CPU 220. With the configuration, the invention can be also adapted to a system in which oscillation frequency changes depending on the environment.

Generally, in the Bluetooth system, as shown in FIG. 4, the master device 610 and the slave devices 620 to 640 have the Bluetooth clocks and perform communications synchronously with each other. The clock of any of the devices has precision of 3.2 kHz +−20 ppm according to standard. The clocks, however, cannot be perfectly made coincide with each other and a deviation occurs with time. In the conventional Bluetooth system, even when clocks are deviated from each other, the frequency of the oscillator is not corrected. The occurred deviation is dealt by changing the value of the clock on the slave device side. Therefore, the slave device has to correct the value of the clock periodically.

Figure 5:
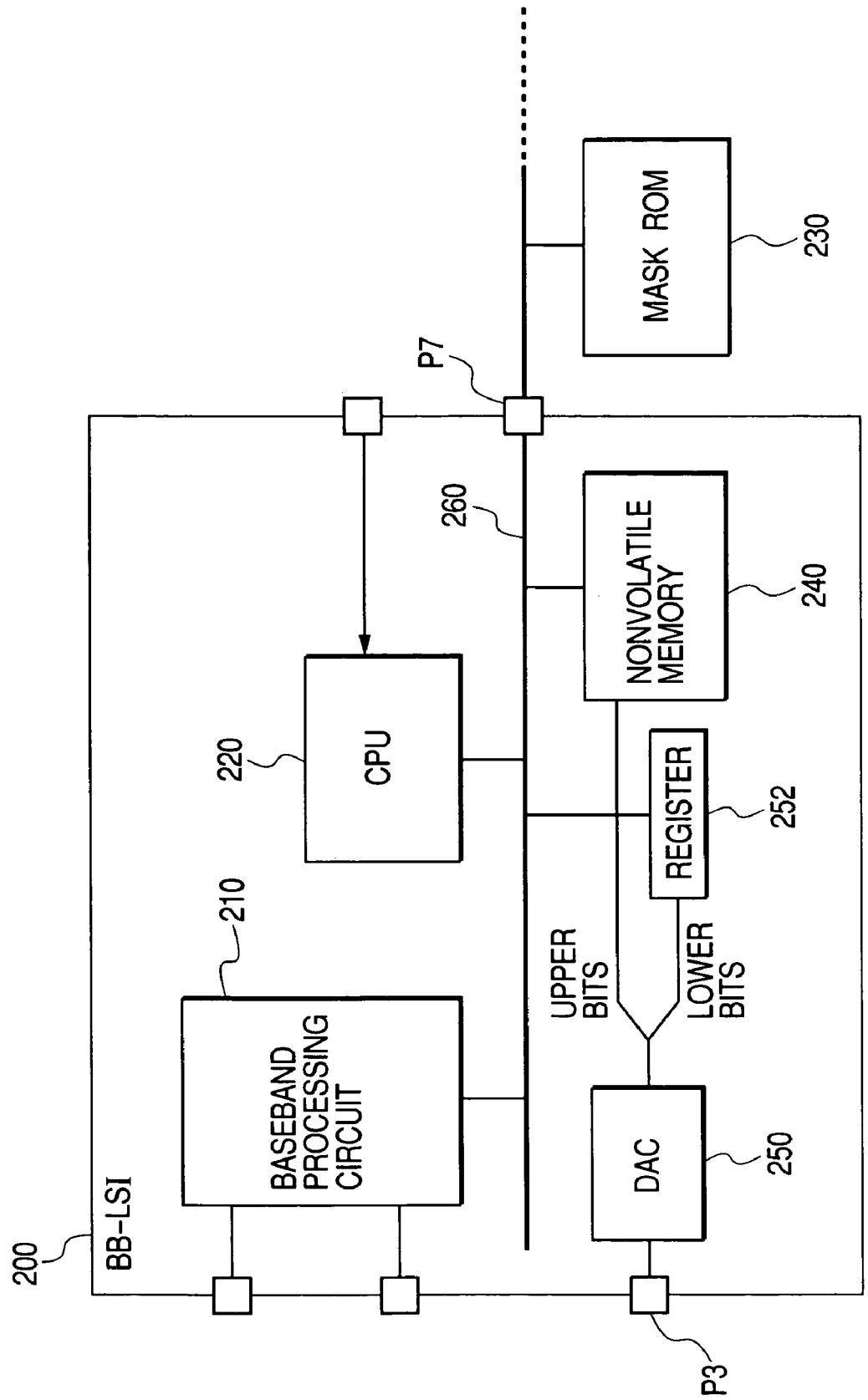
FIG. 5 is a block diagram showing a second embodiment in the case where the invention is applied to a baseband LSI as a component of a Bluetooth communication system.

In contrast, when lower bits in the trimming data for the oscillation frequency can be changed by the register 252 as shown in the embodiment of FIG. 5, there is an advantage such that, by quantitatively calculating a frequency deviation and correcting the frequency itself of the oscillator, the deviation of the Bluetooth clock can be corrected and a correction after that is made unnecessary.

Concretely, for example, when a deviation between the Bluetooth clock in the master device and that in the slave device after lapse of one million slots from the first synchronization time point is one slot, it is sufficient to change lower bits of the trimming data so as to correct the frequency of the oscillator on the slave device side only by 1 ppm.

By the operation, the Bluetooth clock on the slave device side can be made accurately follow the Bluetooth clock on the master device side. In the piconet as shown in FIG. 4, accuracy of the absolute value of the frequency is not so important for maintaining and improving the communication quality but synchronization between the Bluetooth clock of the master and the Bluetooth clock of the slave is important. Therefore, by changing some lower bits in the trimming data of the oscillation frequency on the slave side by the register 252 as described above, the communication quality can be improved.

Further, in the system in which the frequency largely fluctuates due to changes in the use environment such as temperature, if the oscillation frequency can be finely adjusted during operation of the system as in the embodiment, the communication quality can be maintained for long time. In the case where the characteristics of a device change with time, it is feared that the oscillation frequency cannot be accurately adjusted by trimming data at the time of shipping. However, by changing the value of the register 252, the oscillation frequency can be adjusted to a desired value without rewriting the trimming data in the nonvolatile memory 240.

In the second embodiment of FIG. 5, the mask ROM 230 in which the program is stored is constructed as an external device and is connected to the external terminal P7 to which the internal bus 260 is connected. Although the test interface circuit 270 is not shown in FIG. 5, it is omitted for convenience of the diagram. Also in the embodiment, the trimming data can be written to the nonvolatile memory 240 from the not-shown JTAG interface circuit.

FIG. 5 shows that lower bits of the trimming data are supplied from the register 252. Alternately, in place of the register, a means for giving a plurality of fixed codes such as "001", "010", . . . , and "111" and a selector for selecting a desired code from the codes in accordance with a command from the CPU 220 and supplying the selected code to the D/A converter 250 may be provided. Examples of the means for giving the fixed codes are a circuit obtained by combining an inverter and a pull-up resistor or a pull-down resistor connected to the input terminal of the inverter, and a logic circuit including a nonvolatile memory device.

The trimming of the frequency of the oscillating circuit having the quartz oscillator has been described above by using the embodiment. The invention can be also used for, obviously, the case of adjusting the voltage of an external electronic part other than the oscillator such as generation of a control voltage for adjusting the maximum output power of a power amplifier for amplifying a transmission signal and also for setting of operation conditions of a circuit in the chip, mode change, and the like.

Another embodiment of the invention will now be described. In the embodiment described hereinbelow, data other than the trimming data for the oscillation frequency is stored in the nonvolatile memory 240 in the baseband LSI 200.

Figure 6:
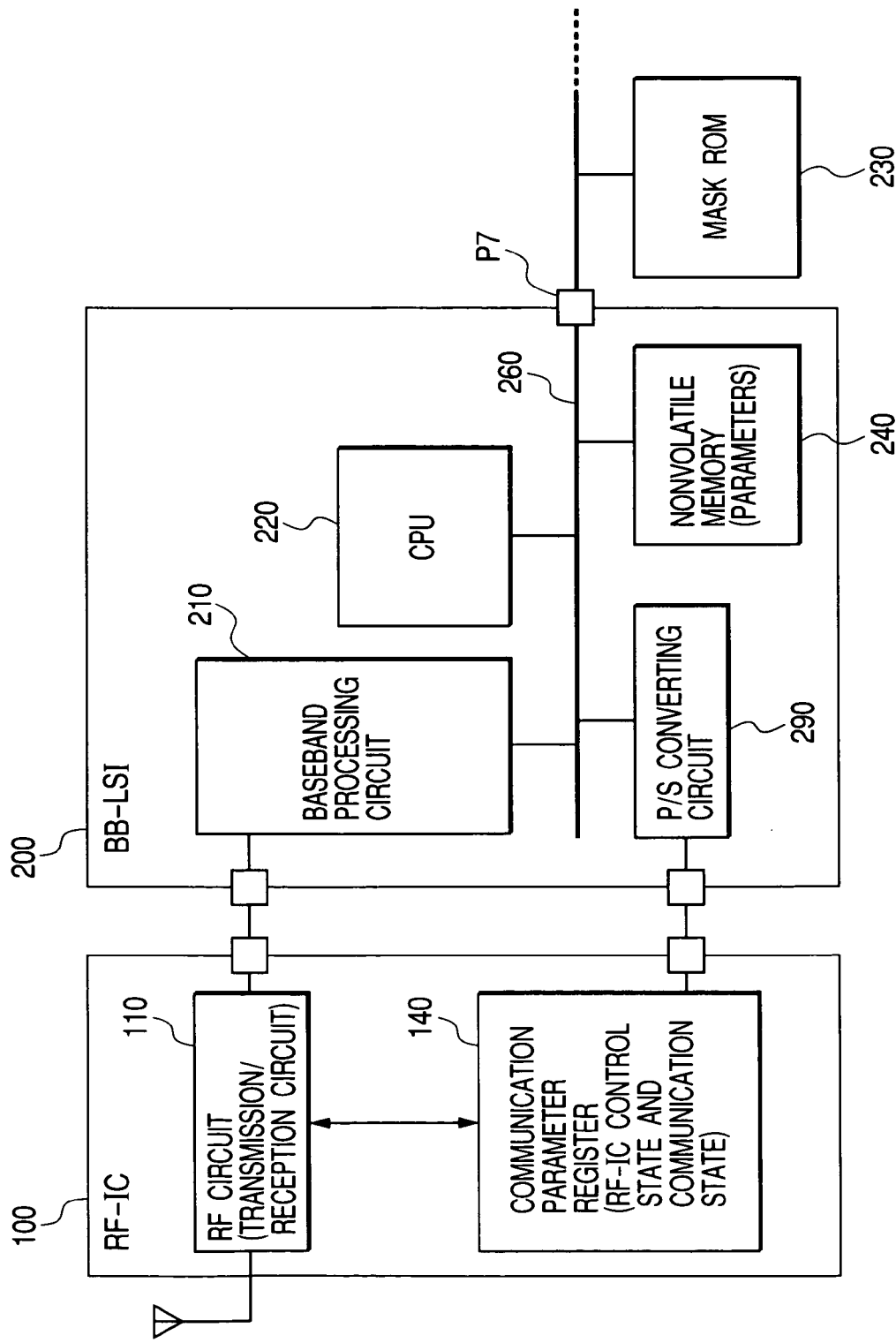
FIG. 6 is a block diagram showing a third embodiment in the case where the invention is applied to a baseband LSI as a component of the Bluetooth communication system.

In the embodiment of FIG. 6, communication state parameters and control parameters of the RF IC are prestored in the nonvolatile memory 240. Before start of communication, the parameters are serially transferred from the baseband LSI 200 to the parameter setting register 140 in the RF IC 100. The baseband LSI 200 has a parallel/serial converting circuit 290 for converting parameters read parallelly from the nonvolatile memory 240 to serial data. The embodiment is effective in the case of applying the invention to a system having a plurality of communication modes of different parameters and a case where communication parameters vary according to a user system to which the invention is applied.

The embodiment does not deny the function of adjusting the frequency of the quartz oscillating circuit 120 on the RF IC 100 side with the trimming data stored in the nonvolatile memory 240 like in the first embodiment. Both the frequency trimming data and the communication parameters can be stored in the nonvolatile memory 240.

Figure 7:
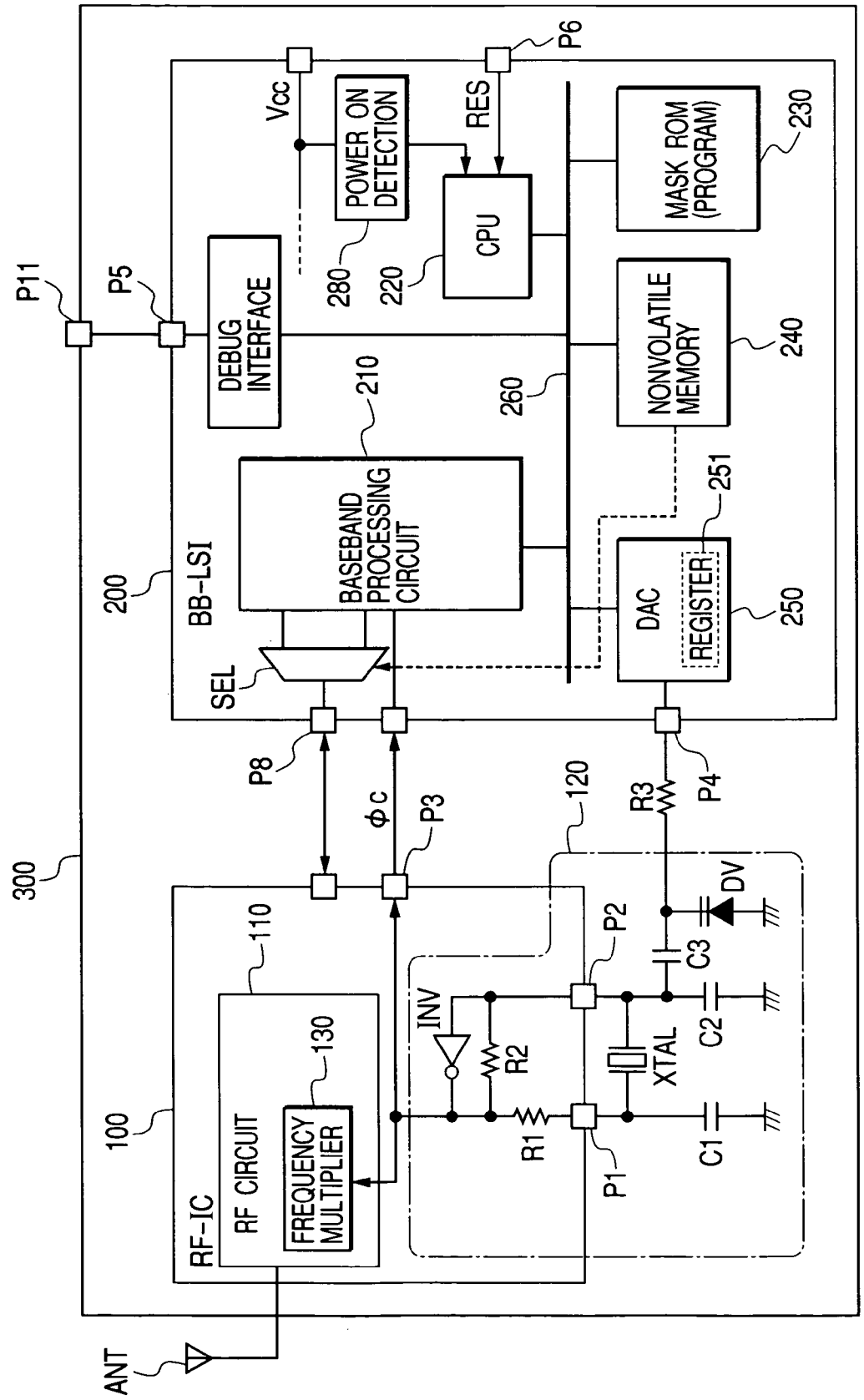
FIG. 7 is a block diagram showing a fourth embodiment in the case where the invention is applied to a baseband LSI as a component of the Bluetooth communication system.
Figure 8:
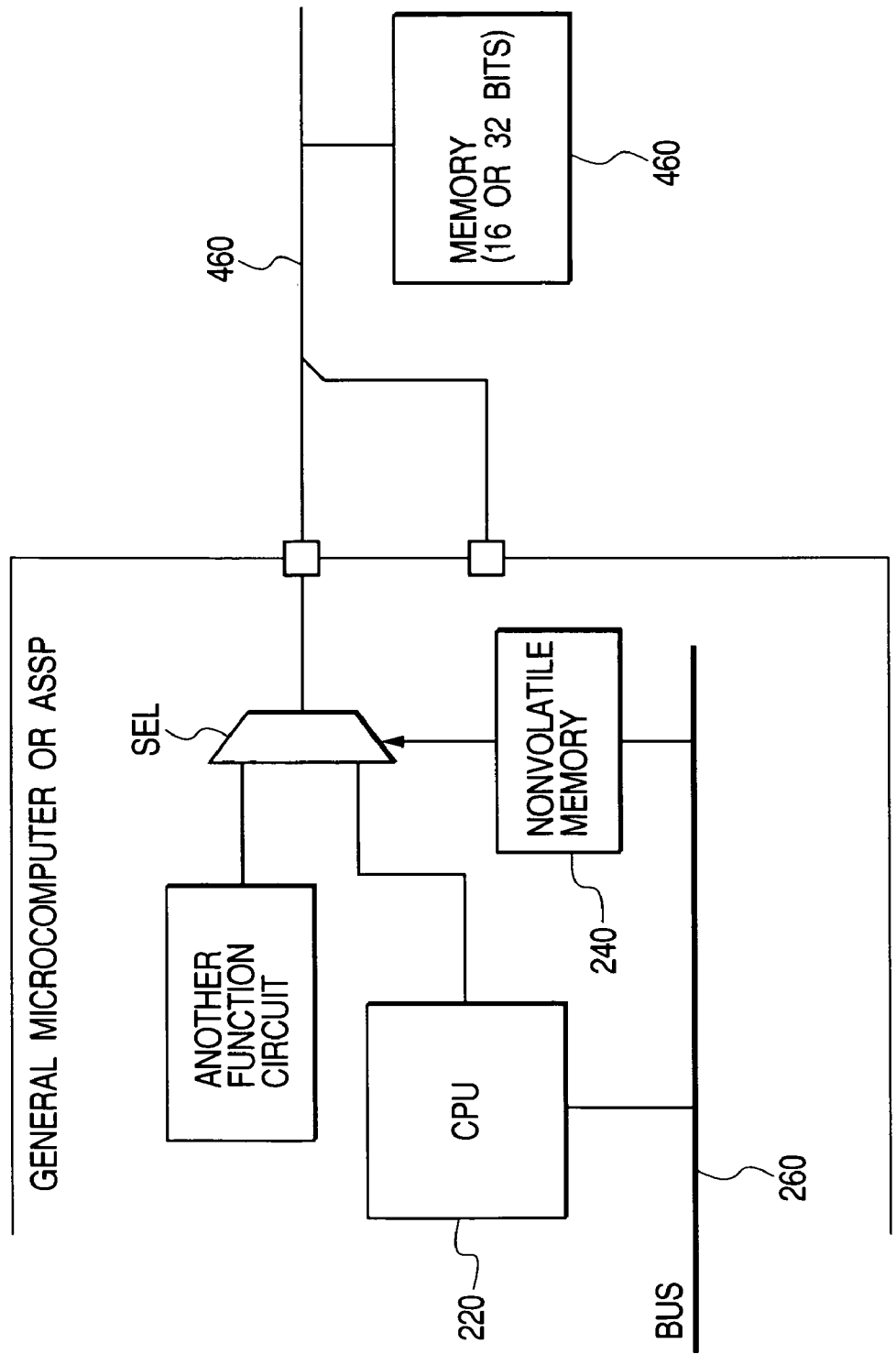
FIG. 8 is a block diagram showing an embodiment in the case where the invention is applied to a general microcomputer LSI.
Figure 9:
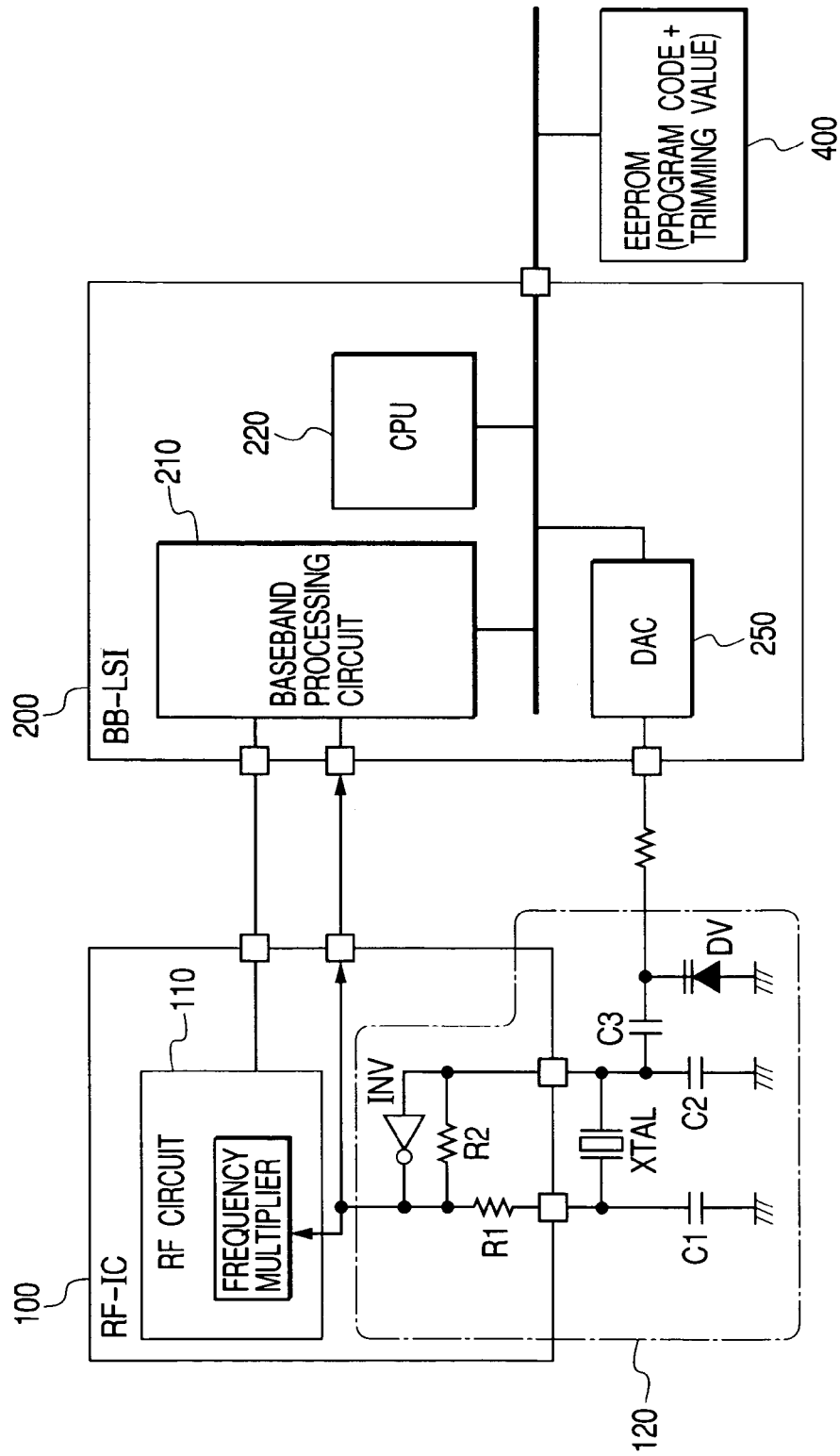
FIG. 9 is a block diagram showing an example of the configuration of a conventional Bluetooth communication system.

FIGS. 7 and 8 show that, in place of a terminal for setting the mode of the LSI, mode setting data stored in the nonvolatile memory 240 is used. A Bluetooth communication system will be described as an example. A plurality of RF ICs of some manufacturers of different system of transmitting/receiving signals to/from the baseband LSI are provided. It is convenient for an assembly maker that an arbitrary RF IC can be selected and combined with the baseband LSI.

In the baseband LSI 200 shown in FIG. 7, interfaces which can be connected to a plurality of RF ICs having different functions and specifications of terminals are provided in an interface portion with the RF IC of the baseband processing circuit 210. A selector SEL for switching an interface according to the RF IC to be combined is provided between the interface portion and an external terminal P8. The selector SEL can switch according to the mode setting data stored in the nonvolatile memory 240. Moreover, the switching of the selector SEL in accordance with the mode setting data stored in the nonvolatile memory 240 is executed by, for example, detecting the power-on of a power source by the power-on detecting circuit described in the first embodiment (FIG. 1).

In the baseband LSI 200 of the embodiment, for example, at the stage an RF IC which is to be mounted on a module and combined is determined, the mode setting data for switching to the interface according to the terminal of the RF IC is written into the nonvolatile memory 240 by the JTAG interface circuit 270. At the turn-on of the power source, the CPU 220 reads the mode setting data from the nonvolatile memory 240 and sends it to the selector SEL, and switching is made so as to select the interface and the terminal function adapted to the RF IC 100 connected. Therefore, it is unnecessary to provide an external terminal for making a mode setting for designating an interface and a terminal function.

In the embodiment, selection of the terminal function which is performed by setting of the mode setting terminal in the conventional baseband LSI 200 can be made by writing to the nonvolatile memory 240. Moreover, writing to the nonvolatile memory 240 can be performed by using the JTAG interface circuit 270 originally provided for the LSI. Consequently, there are advantages such that the number of terminals can be reduced and the chip size can be reduced. For the selector SEL, a register (not shown) for holding the mode setting data read from the nonvolatile memory 240 is provided.

The embodiment is not limited to the switching of the interface with the RF IC but can be also applied to the case where the user can freely select the function or designate an operation mode of, for example, as shown in FIG. 8, setting a memory of 16 bits or 32 bits as an external expanded memory 410 in a general microcomputer or ASSP (Application-Specific Standard Product (IC)).

In such a system, by the time the CPU starts operating, the state of the system has to be determined. As described in the foregoing embodiment, it is preferable to supply data of the nonvolatile memory 240 first to the selector SEL by the power-on reset signal from the power-on detecting circuit or the like and determine the state. In the system of FIG. 8, if 16 bits or 32 bits has not been determined for the external bus 460 and the selected state of the selector SEL has not been determined according to the bits when the CPU 220 starts operation, the CPU 220 cannot even access the external memory 410.

The nonvolatile memory 240 in each of FIGS. 1, 5, 6, 7, and 8 may take the form of a flash memory as a nonvolatile memory having a single-layer polysilicon gate. The configuration will be described hereinbelow.

Figure 10:
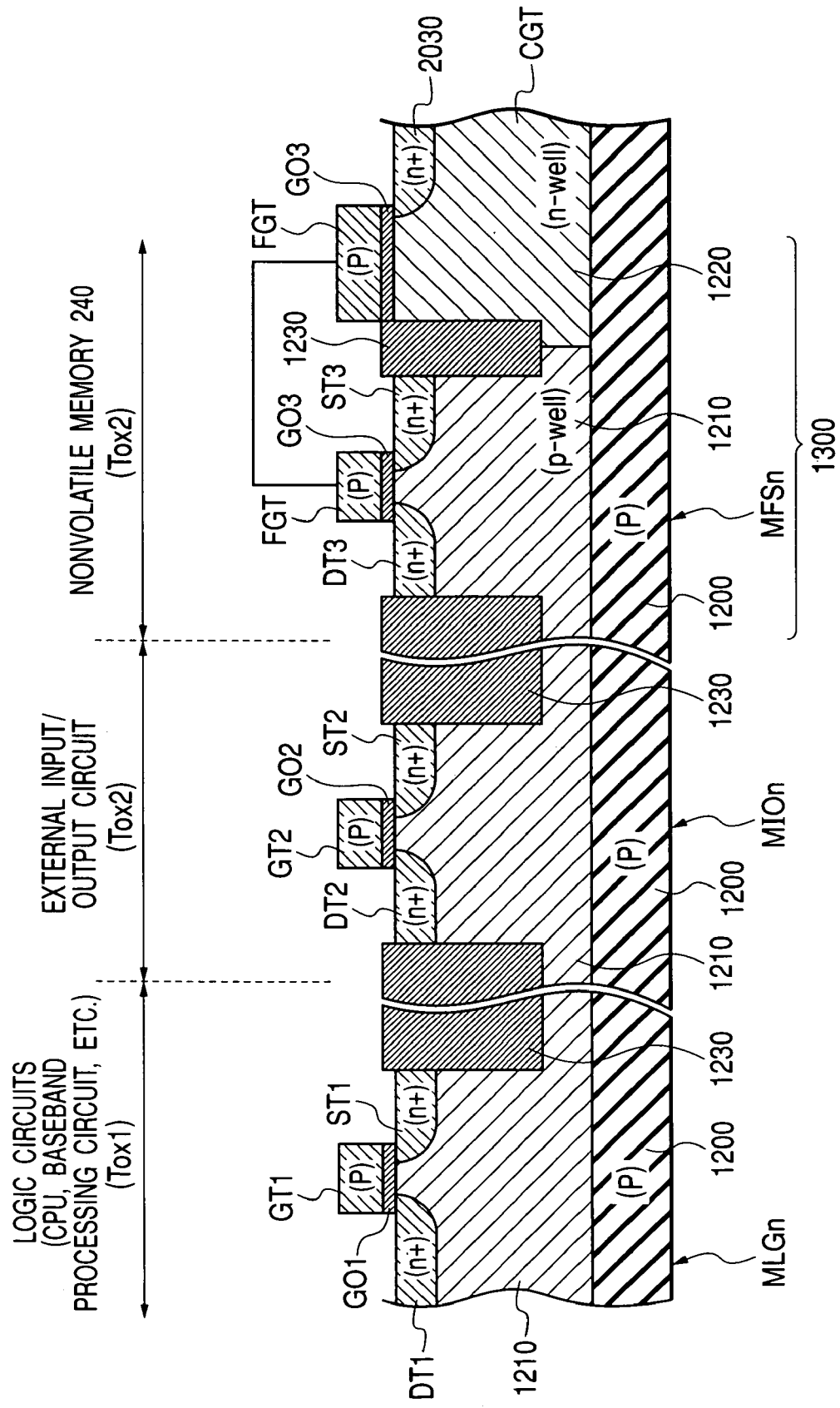
FIG. 10 is a schematic cross section of an n-channel type MIS transistor included in a memory device 1300 as one of a plurality of nonvolatile memory devices included in a nonvolatile memory 240 as a flash memory, an external input/output circuit connected to an external terminal P6, P7, P8 or the like, and a logic circuit such as a CPU 220, or a baseband processing circuit 210.

FIG. 10 schematically shows a sectional structure of n-channel type MIS transistors included in a memory device 1300 as one of nonvolatile memory devices included in the nonvolatile memory 240 as a flash memory, an external input/output circuit coupled to an external terminal P6, P7, P8 or the like, and a logic circuit such as the CPU 220 or the baseband processing circuit 210.

An MIS transistor MLGn included in the logic circuit is formed in a p-type well region 1210 formed in a p-type semiconductor substrate 1200. The p-type well region 1210 is isolated by a device isolation region 1230. The MIS transistor MLGn is constructed by, for example, a gate oxide film (Tox1) G01 having a thickness of 4 nm, a gate GT1 made by an n-type polysilicon film having a thickness of 200 nm, a source ST1 formed in the n-type region, and a drain DT1 formed in the n-type region. An MIS transistor MIOn for the external input/output circuit is formed in the p-type well region 1210 formed in the p-type semiconductor substrate 1200. The p-type well region 1210 is isolated by the device isolation region 1230. The MIS transistor MIOn is constructed by, for example, a gate oxide film G02 (Tox2) having a thickness of 8 nm, a gate GT2 made by an n-type polysilicon film having a thickness of 200 nm, a source ST2 made in the n-type region, and a drain DT2 made in the n-type region.

The nonvolatile memory device 1300 of the flash memory 240 is constructed by an MIS transistor MFSn and a coupling capacity electrode constructing a control gate CGT. Specifically, the MIS transistor MFSn is formed in the p-type well (p-well) 1210 formed in the p-type semiconductor substrate 1200. The P-type well region is isolated by the device isolation region 1230.

The MIS transistor MFSn is constructed by a source ST3 in the n-type region, a drain DT3 in the n-type region, a gate oxide film GO3 (Tox2) having a thickness of 8 nm formed on the channel between the source ST3 and the drain DT3, and a floating gate FGT made by an n-type polysilicon film having a thickness of 200 nm disposed over the gate oxide film GO3. The control gate CGT is formed by an n-type well region (n-well) 1220 formed on the p-type semiconductor substrate 1200. The n-type well region 1220 is isolated by the device isolation region 1230. Over the n-type well region 1220, a part extended from the floating gate FGT is overlaid via the gate oxide film GO3.

The cross section of FIG. 10 shows that the floating gate FGT is interrupted in some midpoint between the MIS transistor MFSn and the control gate CGT. The floating gate is, in reality, continued. In the n type well region 1220, an n+ type region 2030 for connecting the control gate CGT is formed.

As described above, the nonvolatile memory device 1300 in the flash memory 240 has a structure which can be formed over the semiconductor substrate which is the same as that of the logic circuit by a single-layer polysilicon process, that is, a standard CMOS process used for forming a standard CMOS logic circuit LSI. Therefore, in the case where a mask ROM is used as the program memory 230, it is particularly effective since the nonvolatile memory device 1300 can be formed without requiring an additional manufacturing process.

In the case where the program memory 230 is formed by a two-layer polysilicon process for an EEPROM, a flash memory, or the like, the nonvolatile memory device 1300 of the single-layer polysilicon gate shown in FIG. 10 may not be used. In this case, the nonvolatile memory device 1300 may have a two-layer gate structure (structure of two layers of a floating gate and a control gate).

Figure 11:
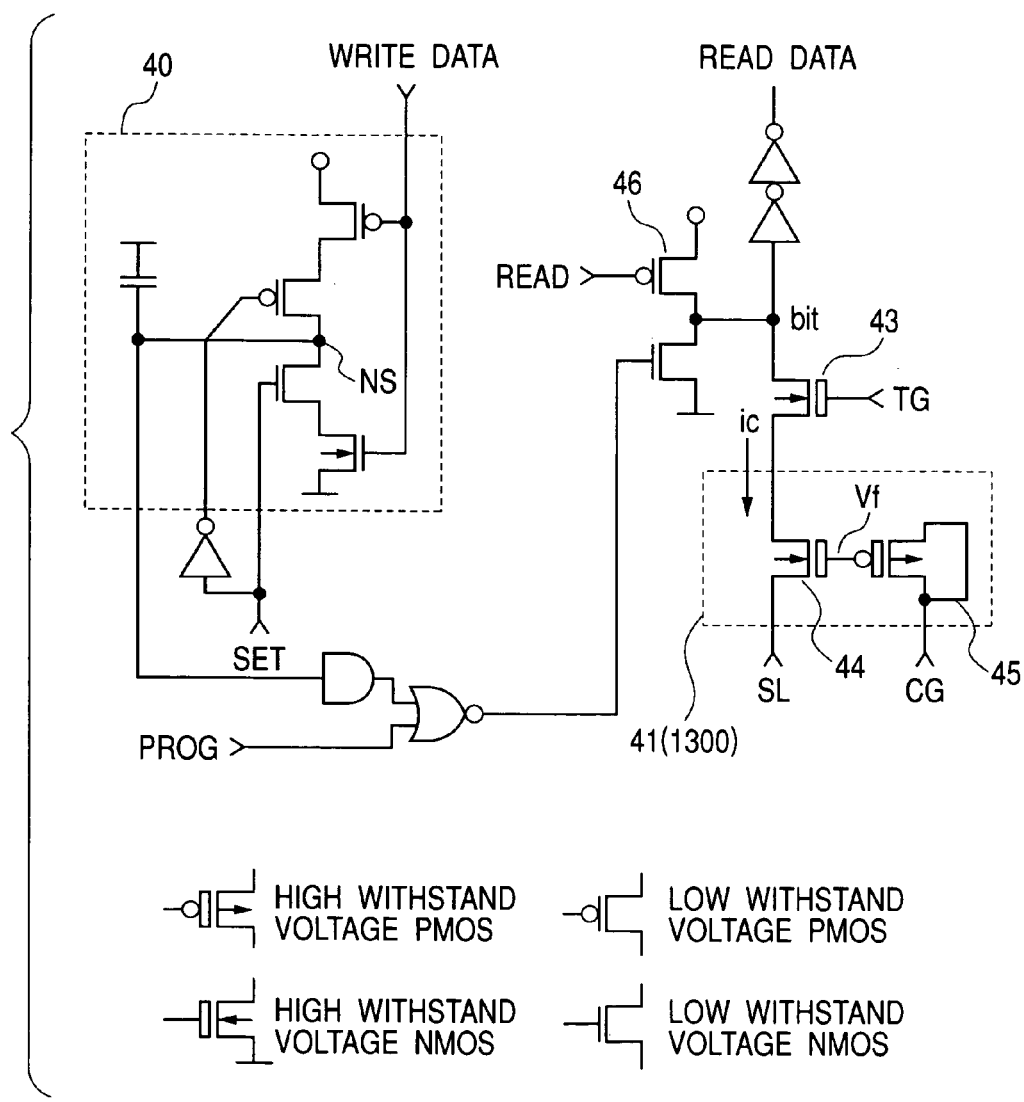
FIG. 11 shows a circuit configuration in the case of using a nonvolatile memory device 1300 of FIG. 10.
Figure 12:
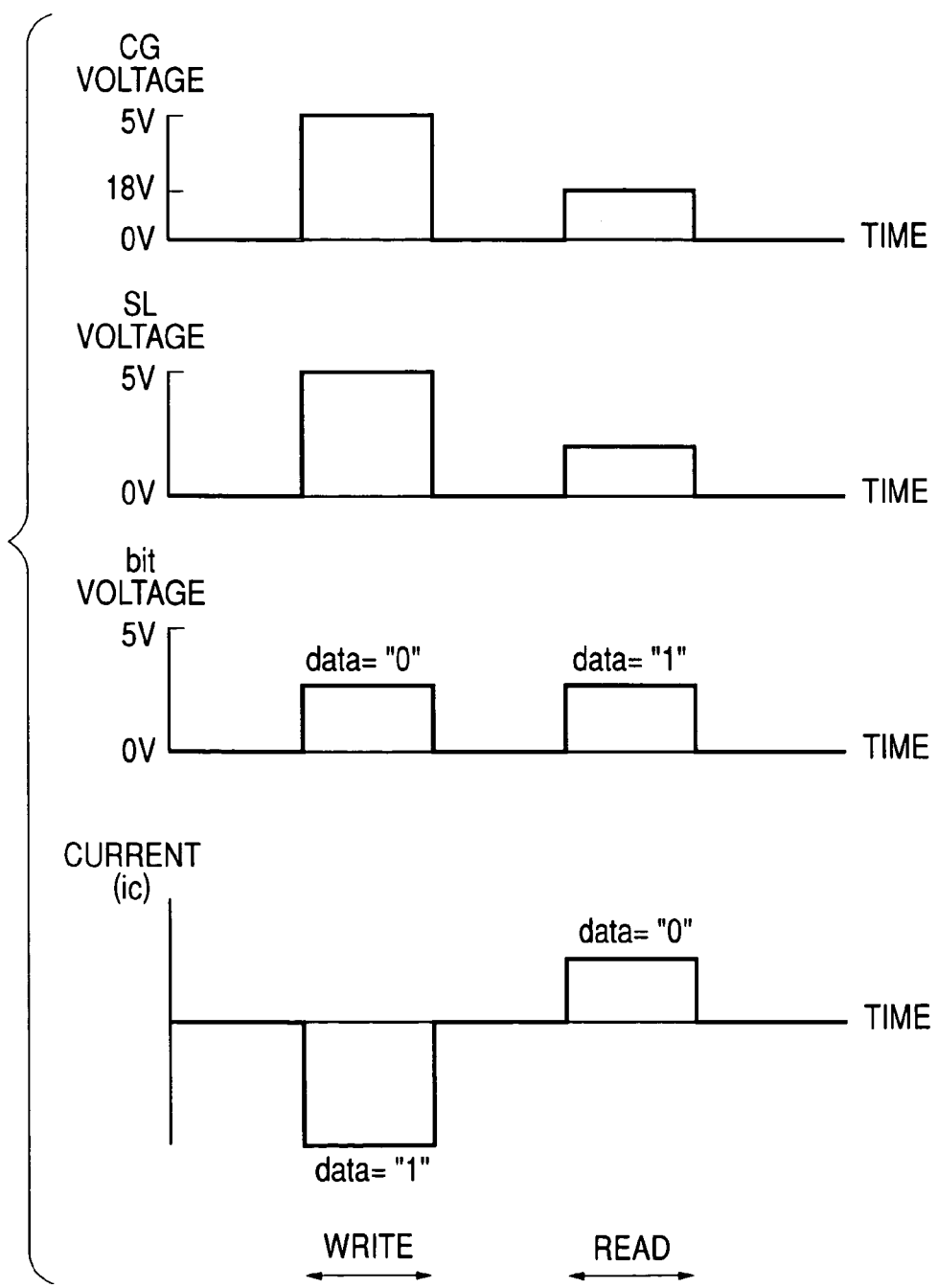
FIG. 12 is an operation waveform chart of writing and reading operations of the circuit of FIG. 11.

FIG. 11 is a circuit configuration in the case of using the nonvolatile memory device 1300 of FIG. 10. FIG. 12 is an operation waveform chart showing writing and reading of the circuit of FIG. 11.

In FIG. 11, reference numeral 40 denotes a register for storing write data, and 41 denotes the nonvolatile memory device 1300 as the flash memory cell. The operation of the flash memory of the invention will be described with reference to FIG. 11.

First, a signal SET is set to "H" and data to be written into the flash memory is set at a node NS in the register 40. The data to be written is, for example, trimming data.

In the case of writing data to the flash memory, first, a signal PROG for permitting a program is set to "L", and a data signal is sent to a MOS transistor 42. When data is "1", the MOS transistor 42 is turned on. On the other hand, when a voltage necessary for writing the flash memory, for example, 5V is applied to a source line SL and a control gate CG as the gate of a flash memory cell, a transistor 44 of the flash memory is turned on.

A voltage is also applied to a through gate TG of a MOS transistor 43 to turn on the MOS transistor 43. At this time, current flows from the source line SL to a path of the MOS transistors 44, 43, and 42. By the flowing current in a state where the drain voltage is high, hot electrons are generated in the channel of the MOS transistor 44, and injected into a floating gate Vf through the barrier of the oxide film.

Consequently, the threshold voltage of the MOS transistor 44 increases and "1" is written. In the case where write data is "0", the MOS transistor 42 is in the off state. At this time, current is not passed to the MOS transistor 44 and the threshold voltage of the MOS transistor 44 does not change. The injected electrons are stored in the floating electrode, so that the electrons are not discharged even after the power source is turned off, and the state is held.

On the other hand, in the reading operation, the voltage of the "H" level, for example, 1.8V at which hot electrons are not generated is applied to the control gate CG. If electrons are injected to the floating gate Vf, the threshold voltage of the MOS transistor 44 is high, so that the MOS transistor 44 is not turned on. If electrons are not injected, the threshold remains low, so that the MOS transistor 44 is not turned on. At the time of reading, a PMOS transistor 46 is turned on by a signal /READ. A predetermined voltage is applied to the through gate TG to turn on the MOS transistor 43. At this time, when data is "1", current is not passed, the voltage at a bit terminal increases, and an "H" level signal is output. When data is "0", the current flows, the voltage at the bit terminal decreases, and an "L" level signal is output.

In the embodiment, as shown in FIG. 11, as the MOS transistors 43, 44, and 45 to which a high voltage is applied for writing, MOS transistors having high withstand voltage are used.

By the flash memory 41 and its circuits, electrical writing and reading operations are performed.

Figure 13:
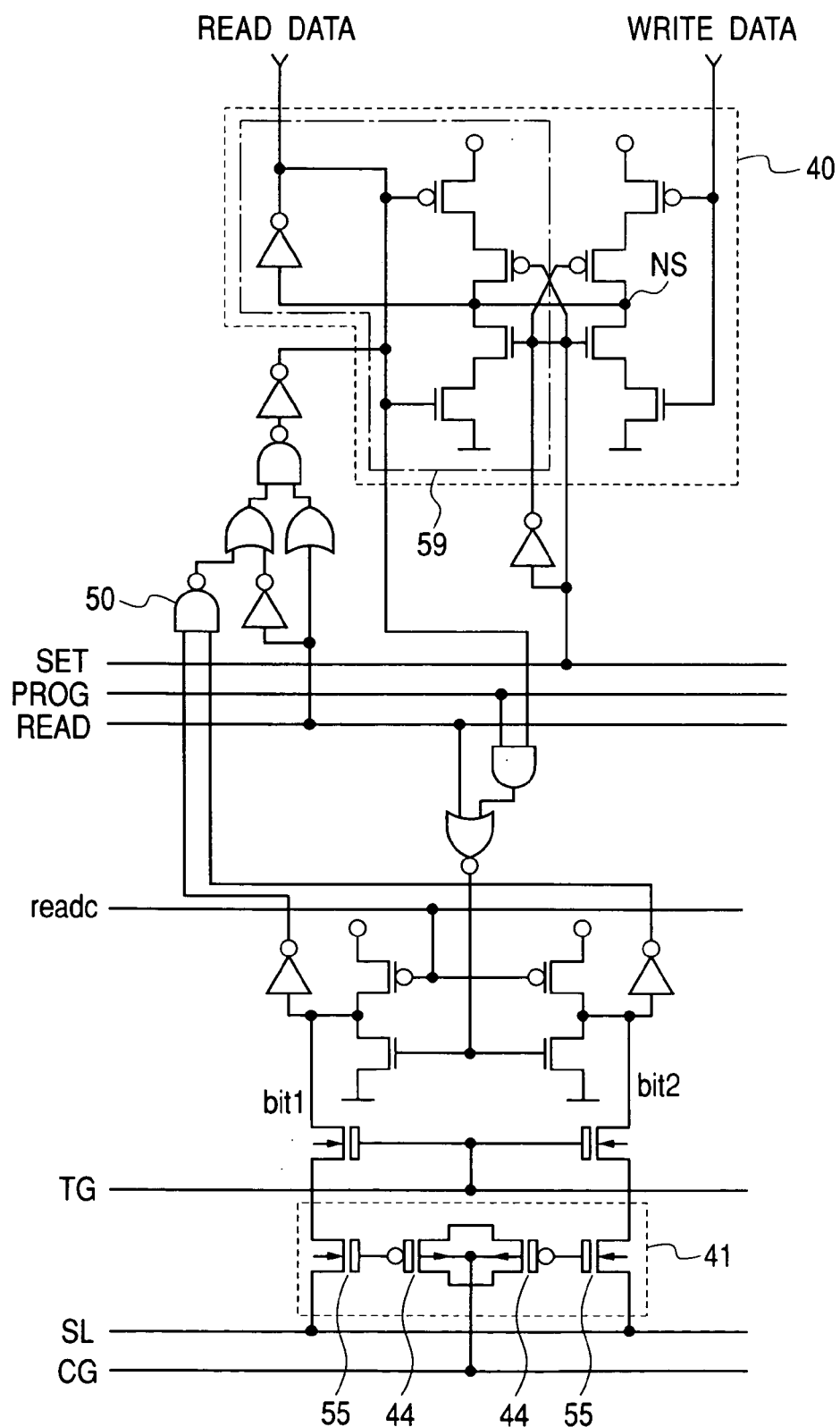
FIG. 13 is a circuit diagram of program bits.
Figure 14:
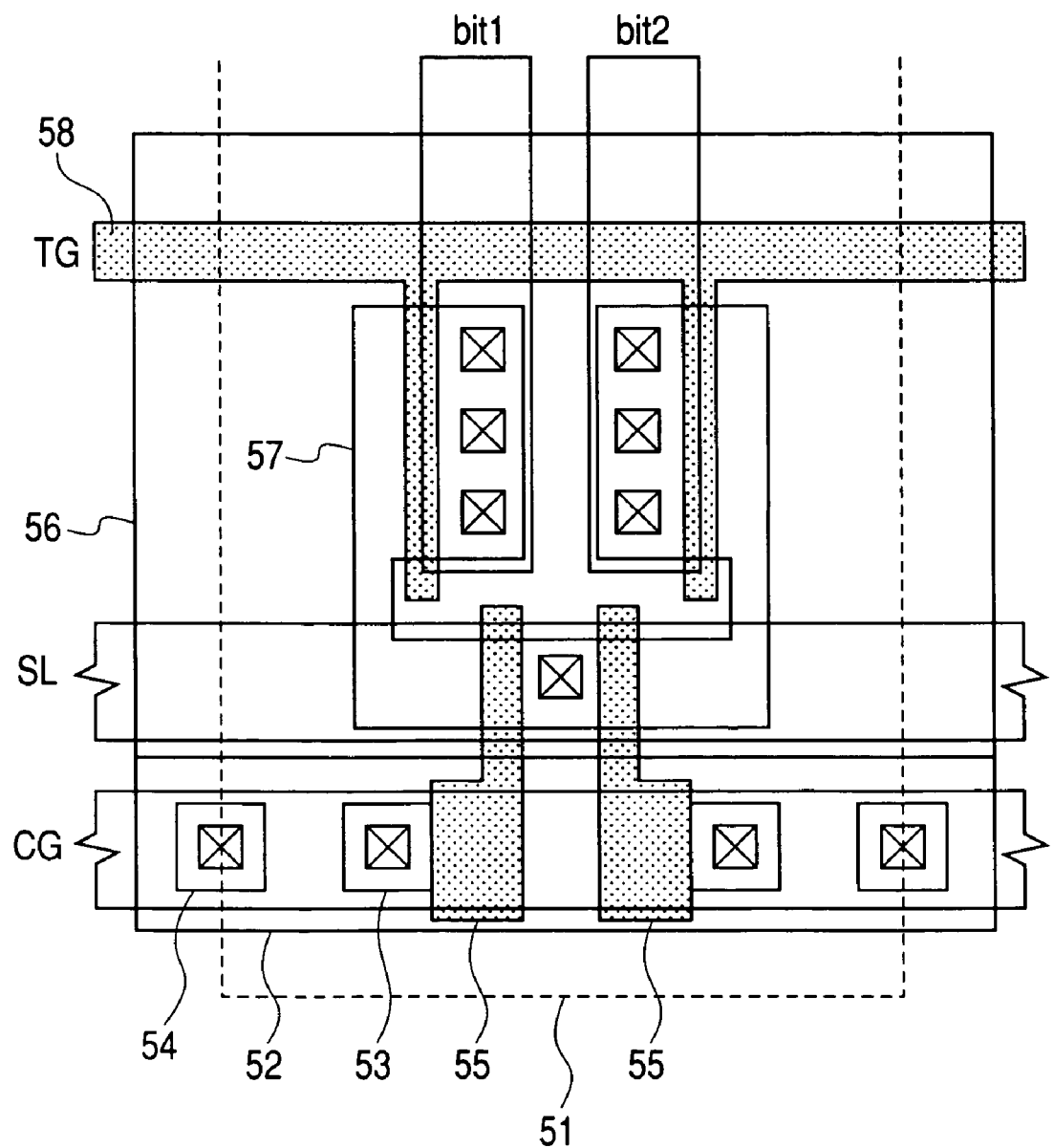
FIG. 14 is a layout diagram of a flash memory cell part.

FIGS. 13 and 14 show an embodiment of a program bit circuit and an embodiment of the layout of the flash memory cell part, respectively, in which certainty and reliability at the time of reading of the flash memory cell 41 is increased more than the circuit shown in FIG. 11.

The flash memory cell 41 holds data by storing electrons in the floating electrode (gate) Vf. In the case of the invention, as the floating electrode, a gate electrode having the same structure as that of the gate electrode of a normal MOS transistor is used. Consequently, as the gate oxide film, no special oxide film is used for storing electrons. However, depending on a device, a leak current of the oxide film is large, and stored charges may escape through the oxide film. In the embodiment, in consideration of such a situation, one bit is constructed by using two flash memory cells, thereby increasing reliability.

The flash memory cell 41 is constructed by two cells. The reading and writing methods are similar to those of the embodiment shown in FIG. 11. In the writing operation, when write data is "0", both of the two memory cells do not perform electron injecting operation. When the write data is "1", both of the two memory cells perform the electron injecting operation and the threshold of the MOS transistor 44 is increased.

In the reading operation, the OR of data read from the two memory cells 44 is calculated by a gate 50. Specifically, when read data is "0" and "0", read data to be output is "0". When read data is "0" and "1", "1" and "0", and "1" and "1", read data to be output is "1". In such a manner, even when electrons stored in a floating electrode in the flash memory cell escape for some reason such as a defect in the oxide film and the threshold decreases, a program bit which does not output erroneous data can be constructed, so that reliability can be increased.

In the embodiment, read data is stored by using not a dynamic type latch for holding charges in a capacitor but a static register 59 using a flip flop circuit (at the time of reading, the signal SET is at the "L" level) for the reason that read data of the program bit has to be always valid as long as the power source of the semiconductor chip is on.

Shown in FIG. 14 are a boundary 51 of program bits, an N-well region 52 as a gate of the flash memory cell, a P+ diffusion layer region 53, an N+ diffusion layer region 54, a floating electrode 55, a P well region 56, an N+ diffusion layer region 57, and a gate electrode 58 serving as the through gate TG. As shown in the layout diagram, even when there are two floating electrodes, the N well region 52 serving as the gate electrode of the flash memory cell is shared, so that it is unnecessary to divide the N well region. Consequently, two flash memory cells can be constructed with the minimum area. A case of arranging a number of program bits is similar to the above.

Although such a method has problems that the circuit scale of the program bit is large and the occupied area increases. In the case of using the method for trimming data, a number of bits are not necessary. The chip area can be set to the size which substantially does not increase the chip area.

According to the embodiments, the following effects are produced.

Without increasing the number of external terminals and external circuits, trimming data can be written into a nonvolatile memory. Thus, the size of the chip and the module can be reduced. Also in the case where characteristics of an electronic part change during use, the trimming data can be rewritten.

Since the process of writing a user program into the nonvolatile memory becomes unnecessary, it produces effects such that the time required to write the nonvolatile memory is shortened, mass productivity is increased, and the manufacturing cost can be reduced.

Further, necessary data can be written in a state where a semiconductor integrated circuit is mounted on a module substrate. Also in the case where the system configuration or operation mode is changed, data can be rewritten according to the change.

Although the invention achieved by the inventors herein has been described concretely on the basis of the embodiments, obviously, the invention is not limited to the foregoing embodiments but can be variously modified without departing from the gist. For example, the invention can be also applied to the case where an LSI has therein a plurality of circuit blocks and the operation of one or some of the circuit blocks is selectively stopped in accordance with the operation mode.

The invention can be applied not only to adjustment of the frequency of the oscillating circuit but also to voltage trimming of an analog circuit such as a voltage regulator and a D/A converter built in an LSI. Further, the invention can be also applied to the case such that a plurality of delay circuits having different delay amounts are provided on a critical path, a delay circuit through which a signal passes is properly selected in accordance with a test result, and the timing is adjusted.

Further, in the foregoing embodiments, a mask ROM is used as the nonvolatile memory for storing a program. Alternately, a flash memory can be used.

The case of applying the invention achieved by the inventors herein to an electronic device having the Bluetooth communication function in the field of utilization as the background of the invention and a communication module as a component of the electronic device has been described above. The invention is not limited to the case. The invention can be widely used for an electronic device having a wireless LAN function having an oscillator in a manner similar to the Bluetooth device, and a module or LSI as a component of a wired communication system, in which a device requiring trimming exists over the substrate or in an LSI chip or mode setting means is provided.

Effects obtained by representative one of the inventions disclosed in the specification will be briefly described as follows.

According to the invention, trimming data in a nonvolatile memory can be rewritten without increasing the number of external terminals and external circuits.

What is claimed is:

1. A semiconductor integrated circuit comprising:
   a rewritable nonvolatile memory for storing first trimming data formed on the semiconductor integrated circuit;
   an interface circuit for test coupled to said nonvolatile memory,
   a digital to analog converter coupled to the nonvolatile memory; and
   a register coupled to the digital to analog converter for storing second trimming data;
   wherein the digital to analog converter receives the stored first trimming data from said nonvolatile memory and receives the second trimming data from the register and outputs adjustment data, and
   wherein said nonvolatile memory stores said trimming data for correcting a change in circuit characteristics which occurs due to variations in electronic parts or devices, via said interface circuit for test.

2. The semiconductor integrated circuit according to claim 1, further comprising:
   a terminal for outputting the adjustment data.

3. The semiconductor integrated circuit according to claim 1, further comprising:
   a microprocessor for executing control in accordance with commands of a program; and
   a program memory for storing said program commands executed by the microprocessor,
   wherein said microprocessor reads the adjustment data stored in said nonvolatile.

4. The semiconductor integrated circuit according to claim 1, wherein said electronic part is a quartz oscillator, and said adjustment data is data for adjusting an oscillation frequency of an oscillating circuit including said quartz oscillator.

5. The semiconductor integrated circuit according to claim 1, wherein the first trimming data is upper bit trimming data and the second trimming data is lower bit trimming data.

6. The semiconductor integrated circuit according to claim 5, wherein the register is coupled to the microprocessor and the microprocessor determines the lower bit trimming data to synchronize a slave clock to a master clock.

7. An electronic system comprising:
   an electronic part;
   a first semiconductor integrated circuit including:
      a first nonvolatile memory formed on the said first semiconductor integrated circuit,
      a microprocessor coupled to the first nonvolatile memory and configured to execute a sequence of programmed instructions,
      an interface circuit for test coupled to the first nonvolatile memory,
      a second nonvolatile memory coupled to the microprocessor for storing said instructions executed by the microprocessor, wherein said first nonvolatile memory stores first trimming data for correcting a change in circuit characteristics which occurs due to variations in said electronic part;
a digital to analog converter coupled to the first nonvolatile memory; and
a register coupled to the digital to analog converter for storing second trimming data;
wherein the digital to analog converter receives the stored first trimming data from said first nonvolatile memory and receives the second trimming data from the lower bit register and outputs adjustment data; and
a substrate over which the electronic part and the first semiconductor integrated circuit are mounted,
wherein said first nonvolatile memory is rewritable for storing updated first trimming data.

8. The electronic system according to claim 7, wherein said first nonvolatile memory stores said first trimming data received via a terminal, wherein the terminal is a test terminal provided over said substrate.

9. The electronic system according to claim 7, wherein said first semiconductor integrated circuit has an interface circuit for test, and wherein said first nonvolatile memory stores said adjustment data received via said interface circuit for test.

10. The electronic system according to claim 7, wherein said second nonvolatile memory is a mask ROM.

11. The electronic system according to claim 7, wherein said electronic part is a quartz oscillator, and said adjustment data is data for adjusting an oscillation frequency of an oscillating circuit including said quartz oscillator.

12. The electronic system according to claim 11, further comprising a second semiconductor integrated circuit in which a device is formed that provides an oscillating circuit when coupled to said quartz oscillator,
wherein a clock signal generated by said second semiconductor integrated circuit is supplied as a reference clock signal to said first semiconductor integrated circuit.

13. The electronic system according to claim 12, wherein said first semiconductor integrated circuit is a semiconductor integrated circuit for performing a baseband signal process for communication, and said second semiconductor integrated circuit is a semiconductor integrated circuit having a radio frequency transmission/reception function.

14. The semiconductor integrated circuit according to claim 8, wherein the first trimming data is upper bit trimming data and the second trimming data is lower bit trimming data.

15. The electronic system according to claim 14, wherein the register is coupled to the microprocessor and the microprocessor determines the lower bit trimming data to synchronize a slave clock to a master clock.

16. A semiconductor integrated circuit comprising:
a rewritable nonvolatile memory formed on the semiconductor integrated circuit;
an interface circuit for test coupled to the nonvolatile memory,
a digital to analog converter coupled to the nonvolatile memory; and
a register coupled to the digital to analog converter for storing second trimming data;
wherein the digital to analog converter receives the stored first trimming data from said nonvolatile memory and receives the second trimming data from the register and outputs adjustment data, and
wherein said nonvolatile memory stores said first trimming data for correcting a change in circuit characteristics caused by variations in electronic parts or devices, and data peculiar to the semiconductor integrated circuit, via said interface circuit for test.

17. The semiconductor integrated circuit according to claim 16, wherein said electronic part is a quartz oscillator, and said adjustment data is data for adjusting oscillation frequency of an oscillating circuit including said quartz oscillator.

18. The semiconductor integrated circuit according to claim 16, wherein the second trimming data is lower bit trimming data.

19. The semiconductor integrated circuit according to claim 18, wherein the register is coupled to the microprocessor and the microprocessor determines the lower bit trimming data to synchronize a slave clock to a master clock.

* * * * *